United States Patent
Takemae et al.

(10) Patent No.: US 6,215,714 B1
(45) Date of Patent: Apr. 10, 2001

(54) SEMICONDUCTOR MEMORY DEVICE CAPABLE OF REDUCING POWER CONSUMPTION IN SELF-REFRESH OPERATION

(75) Inventors: Yoshihiro Takemae; Yasurou Matsuzaki, both of Kawasaki (JP)

(73) Assignee: Fujitsu Limited, Kangawa (JP)

(*) Notice: Subject to any disclaimer, the term of this patent is extended or adjusted under 35 U.S.C. 154(b) by 0 days.

(21) Appl. No.: 09/517,279

(22) Filed: Mar. 2, 2000

(30) Foreign Application Priority Data

Apr. 14, 1999 (JP) .................................................. 11-106813

(51) Int. Cl.$^7$ .................................................. G11C 7/00
(52) U.S. Cl. .................................................. 365/222; 365/227
(58) Field of Search .................................................. 365/222, 227, 365/228

(56) References Cited

U.S. PATENT DOCUMENTS

| | | | |
|---|---|---|---|
| 4,570,242 | * 2/1986 | Nagami | 365/222 |
| 5,262,998 | * 11/1993 | Mnich et al. | 365/222 |
| 5,331,601 | * 7/1994 | Parris | 365/230.08 |
| 5,499,213 | * 3/1996 | Niimi et al. | 365/222 |
| 5,640,357 | * 6/1997 | Kakimi | 365/229 |

FOREIGN PATENT DOCUMENTS

| | | |
|---|---|---|
| 2-192096 | 7/1990 | (JP) . |
| 9-128965 | 5/1997 | (JP) . |
| 10-255468 | 9/1998 | (JP) . |

* cited by examiner

*Primary Examiner*—Son Mai
(74) *Attorney, Agent, or Firm*—Arent Fox Kintner Plotkin & Kahn, PLLC

(57) ABSTRACT

A semiconductor memory device, which refreshes memory cells to retain data, has a first refresh mode and a second refresh mode. The first refresh mode is a mode for refreshing all of the memory cells, and the second refresh mode is a mode for refreshing a part of the memory cells. By refreshing only designated areas where data must be retained, power consumption in a refresh operation can be reduced, drastically cutting power consumption in a power-down mode.

28 Claims, 8 Drawing Sheets

SEMICONDUCTOR MEMORY DEVICE CAPABLE OF REDUCING POWER CONSUMPTION IN SELF-REFRESH OPERATION

BACKGROUND OF THE INVENTION

1. Field of the Invention

The present invention relates to a semiconductor memory device and, more particularly, to a dynamic semiconductor memory device which requires periodic refreshing to retain memory cell contents.

2. Description of the Related Art

With advances in semiconductor manufacturing technology, the packing density and storage capacity of dynamic semiconductor memory devices such as DRAMs (Dynamic Random Access Memories) have been increasing in recent years. In such semiconductor memory devices, a refresh operation in active mode is performed based on an externally applied refresh command, while a refresh operation in power down mode is performed by generating a clock using an oscillator or the like internal to the device, and the addresses of the memory cells to be refreshed are automatically generated by a refresh address counter incorporated in the device.

These prior art DRAMs (or SDRAMs: Synchronous DRAMs) have been configured to refresh all the memory cells in the refresh operation, whether the device is in the active mode or in the power down mode.

However, there are some applications in which the amount of information handled at a time is large but the amount of information that must be retained continuously is small, and consequently, there are many cases in which the data only in selected memory cells in the DRAM need to retained when in the power down state.

Specifically, in battery powered portable terminals (for example, portable telephones), in many cases, if only part of the data in the power-on state can be retained, all the other information need not be retained when in the power down state. However, since the prior art dynamic semiconductor memory device is configured to refresh all the memory cells in the DRAM, it has been difficult to further reduce the power consumption in the power down mode. The need for reducing the power consumption is demanded not only for battery powered portable terminals but also for various other appliances that use dynamic semiconductor memory devices.

The prior art and its associated problem will be described later, in detail, with reference to accompanying drawings.

SUMMARY OF THE INVENTION

An object of the present invention is to provide a semiconductor memory device that reduces its power consumption in refresh operation and drastically cuts its power consumption in power down mode by refreshing necessary areas only.

According to the present invention, there is provided a semiconductor memory device refreshing memory cells to retain data, comprising a first refresh mode for refreshing all of the memory cells; and a second refresh mode for refreshing at least part of the memory cells.

The semiconductor memory device may further comprise a refresh address register for storing address information designating the memory cells to be refreshed in the second refresh mode. The refresh address register may be provided as part of a mode register.

The semiconductor memory device may further comprise a refresh address counter for generating a refresh address; and a comparator for comparing the refresh address with the information stored in the refresh address register wherein, in the first refresh mode, refreshing may be performed at each refresh address generated by the refresh address counter and, in the second refresh mode, refreshing may be performed in accordance with the comparison result output from the comparator.

The semiconductor memory device may further comprise a refresh address counter for generating a refresh address, wherein in the first refresh mode, refreshing may be performed at each refresh address generated by the refresh address counter and, in the second refresh mode, a count range within which the refresh address counter generates the refresh address may be limited in accordance with the information stored in the refresh address register.

The information stored in the refresh address register may include a minimum value defining an address range within which refreshing is performed in the second refresh mode. The information stored in the refresh address register may include a maximum value defining an address range within which refreshing is performed in the second refresh mode. The information stored in the refresh address register may include a minimum value and a maximum value defining an address range within which refreshing is performed in the second refresh mode. The information stored in the refresh address register may include a count of the number of refresh operations required to refresh all of the memory cells designated to be refreshed in the second refresh mode.

The information stored in the refresh address register may include an initial value to be set in the refresh address counter. The initial value to be set in the refresh address counter may be a minimum value or a maximum value defining an address range within which refreshing is performed.

The information stored in the refresh address register may include an initial value to be set in the refresh address counter and a count of the number of refresh operations required to refresh all of the memory cells designated to be refreshed in the second refresh mode. The initial value to be set in the refresh address counter may be a minimum value or a maximum value defining an address range within which refreshing is performed. The semiconductor memory device may further comprise a plurality of memory cell blocks and the information stored in the refresh address register may include address information for selecting a memory cell block to be refreshed in the second refresh mode.

The semiconductor memory device may further comprise a refresh address counter for counting a first refresh address; and a refresh address generator for generating a second refresh address based on at least part of the output of the refresh address counter and on the information stored in the refresh address register, wherein, in the first refresh mode, refreshing may be performed at the first refresh address and, in the second refresh mode, refreshing may be performed at the second refresh address. The refresh address generator may include a selector. The semiconductor memory device may further comprise a plurality of memory cell blocks and the information stored in the refresh address register may include address information for selecting a memory cell block to be refreshed in the second refresh mode.

In the first refresh mode, refreshing may be performed in synchronism with an external timing signal, and in the second refresh mode, refreshing may be performed in synchronism with an internally generated clock. The frequency of refresh operation in the second refresh mode may be varied in accordance with the number of memory cells designated by the information stored in the refresh address register as the memory cells to be refreshed. The second refresh mode may be a mode for performing self refresh on memory cells when in a power down state.

BRIEF DESCRIPTION OF THE DRAWINGS

The present invention will be more clearly understood from the description of the preferred embodiments as set forth below with reference to the accompanying drawings, wherein.

DESCRIPTION OF THE PREFERRED EMBODIMENTS

Before proceeding to a detailed description of the semiconductor memory device of the present invention, a prior art semiconductor memory device and its associated problem will be described first with reference to FIG. 1.

Figure 1:
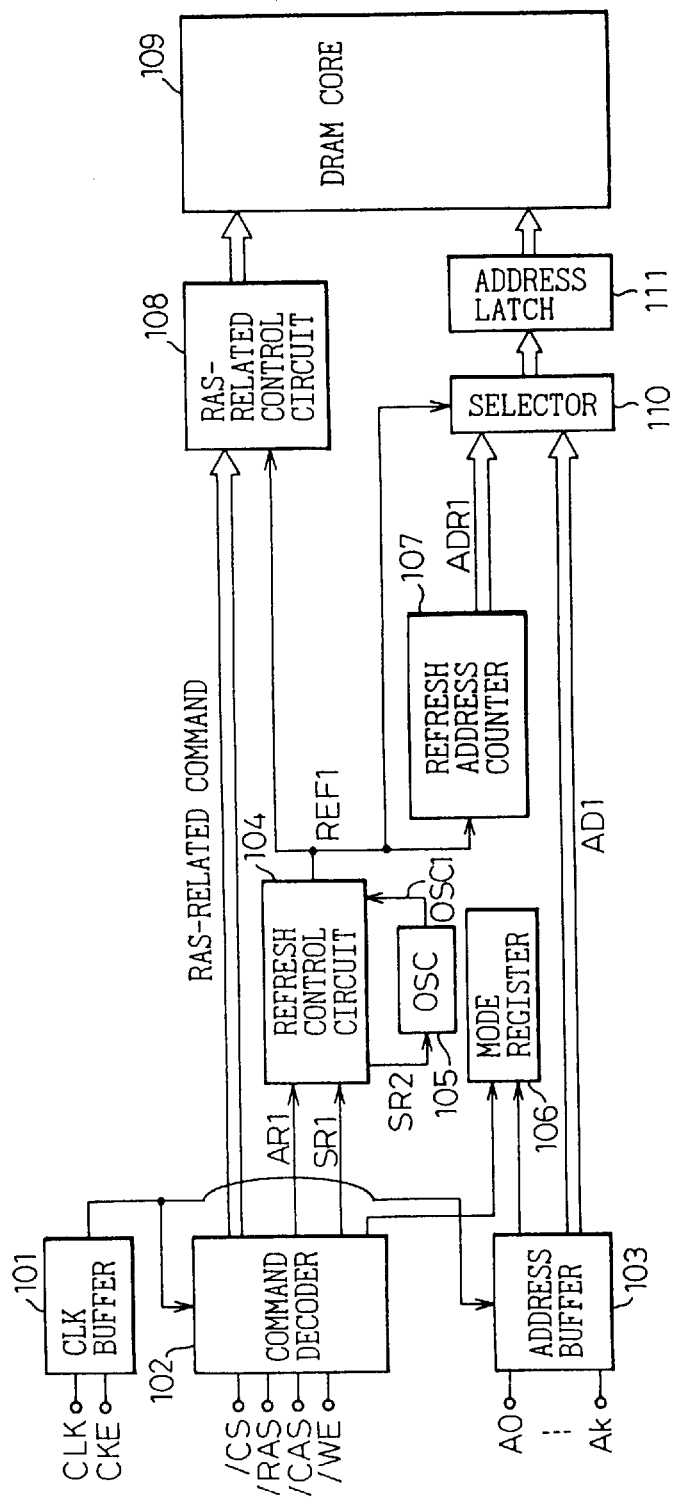
FIG. 1 is a block diagram showing one example of a prior art semiconductor memory device.

FIG. 1 is a block diagram showing one example of the prior art semiconductor memory device; here, the configuration of a refresh circuit in a synchronous DRAM (SDRAM) is shown. In FIG. 1, reference numeral 101 is a clock buffer (CLK buffer), 102 is a command decoder, 103 is an address buffer, 104 is a refresh control circuit, 105 is an oscillator (OSC), and 106 is a mode register. Further, reference numeral 107 is a refresh address counter, 108 is a RAS-related control circuit, 109 is a DRAM core, 110 is a selector, and 111 is an address latch.

In the prior art SDRAM (semiconductor memory device) shown in FIG. 1 and when, in an active mode, an external refresh command (AUTO REFRESH) is input, the command decoder 102 issues a refresh command signal AR1 to the refresh control circuit 104 which, based on the refresh command signal AR1, generates a refresh control signal REF1. Here, chip select signal /CS, row address strobe signal /RAS, column address strobe signal /CAS, and write enable signal /WE are input to the command decoder 102, and clock CLK and clock enable signal CKE are input to the CLK buffer 101, while address signals A0 to Ak are input to the address buffer 103. The refresh command (AUTO REFRESH) here is externally supplied, for example, as a combination of the clock enable signal CKE, row address strobe signal /RAS, etc.

The refresh address counter 107 is configured as a counter which counts up the address by one each time the refresh control signal REF1 is input, and automatically generates a refresh address ADR1 for every input of the refresh control signal REF1. The refresh control signal REF1 is also supplied to the selector 110; when the refresh control signal REF1 is input, the selector 110 selects the refresh address ADR1 output from the refresh address counter 107, otherwise (when the refresh control signal REF1 is not input) it selects an externally supplied address AD1 delivered from the address buffer 103, and whichever address is selected is passed to the address latch 111.

The refresh control signal REF1 is also supplied to the RAS-related control circuit 108 which thereupon refreshes the memory cells connected to the word line in the DRAM core 109 which is selected by the output of the address latch 111. To retain the contents of all the memory cells in the DRAM core 109, the refresh operation is repeated by entering the refresh command a predetermined number of times within a predetermined period of time.

To implement the power down mode, when an external self-refresh command (SELF REFRESH) is applied during the active mode, the command decoder 102 issues a self-refresh command signal SR1, and the device (semiconductor memory device) is placed in the power down mode. Self refresh here means the power down mode in which a refresh operation is continued.

When the self-refresh command signal SR1 is input, the refresh control circuit 104 issues a control signal SR2 to activate the oscillator (OSC) 105, and periodically generates the refresh control signal REF1 based on the clock signal generated by the oscillator 105. The operation of the selector 110, RAS-related control circuit 108, etc. is the same as the refresh operation in the active mode described above, and the description will not be repeated here.

The mode register 106 accepts outputs from the command decoder 102 and the address buffer 103, and stores information defining, for example, a burst length in the burst mode of the SDRAM, a latency from the input of a command to the output of data, etc.

As described above, the prior art dynamic semiconductor memory device (SDRAM) is configured to refresh all the memory cells in the DRAM core 109 in the refresh operation, whether the device is in the active mode or in the power down mode.

However, there are some applications in which the amount of information handled at a time is large but the amount of information that must be retained continuously is small, and consequently, there are many cases in which the data in only selected memory cells in the DRAM core 109 must be retained in the power down state. Specifically, in battery powered portable terminals (for example, portable telephones), in many cases, if only part of the data in the power-on state can be retained, all other information need not be retained when in the power down state.

However, since the prior art dynamic semiconductor memory device is configured to refresh all the memory cells in the DRAM core 109, it has been difficult to further reduce the power consumption (for example, several hundred microamperes) in the power down mode. Specifically, in battery powered portable terminals and the like, since the power consumption in the power down mode directly affects the continuous standby time, for example, it is very important to reduce the power consumption in the power down mode. The need for reducing the power consumption is in demand not only for battery powered portable terminals but also for various other appliances that use dynamic semiconductor memory devices.

Embodiments of the semiconductor memory device according to the present invention will be described in detail below with reference to the accompanying drawings.

Figure 2:
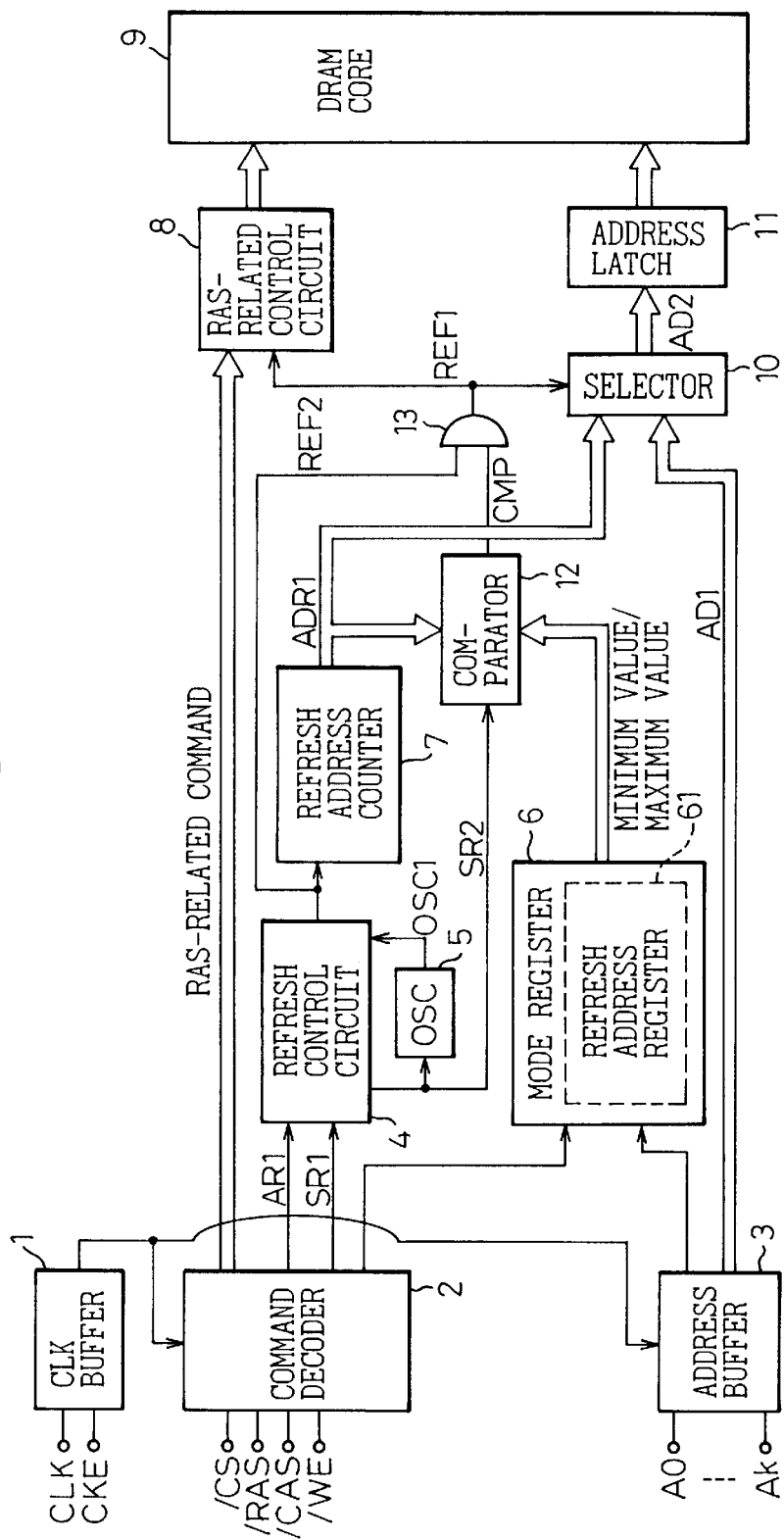
FIG. 2 is a block diagram showing a first embodiment of a semiconductor memory device according to the present invention.

FIG. 2 is a block diagram showing a first embodiment of the semiconductor memory device according to the present invention; here, the configuration of a refresh circuit in a synchronous DRAM (SDRAM) is shown. In FIG. 2, reference numeral 1 is a clock buffer (CLK buffer), 2 is a command decoder, 3 is an address buffer, 4 is a refresh control circuit, 5 is an oscillator (OSC), and 6 is a mode register. Further, reference numeral 7 is a refresh address counter, 8 is a RAS-related control circuit, 9 is a DRAM core, 10 is a selector, 11 is an address latch, 12 is a comparator, and 13 is an AND gate.

As is apparent from a comparison between the semiconductor memory device of the first embodiment of the present invention shown in FIG. 2 and the prior art semiconductor memory device shown in FIG. 1, the first embodiment differs from the prior art of FIG. 1 by the inclusion of the comparator 12, the AND gate 13, and a refresh address register 61 as part of the mode register 6.

More specifically, in the SDRAM (semiconductor memory device) of the first embodiment shown in FIG. 2, the refresh address register 61 stores a maximum value and a minimum value defining the address range of the memory cells to be self-refreshed (or a block select address for selecting the memory cell block to be self-refreshed in the DRAM core 9). The minimum and maximum values stored in the refresh address register 61 are supplied to the comparator 12 for comparison with ADR1 output from the refresh address counter. In the first embodiment, the refresh address register 61 is configured as the same register as the mode register 6 (incorporated in the mode register 6), and is set up, for example, by external command signals (/CS, /RAS, /CAS, /WE) and address signals (A0 to Ak) during the setting up of the mode register after power on; alternatively, the register may be set up using masks at the time of chip manufacture or may be programmed using laser fuses or the like, or the setting may be changed by changing wire bonding accordingly.

The comparator 12 compares the refresh address ADR1 generated by the refresh address counter 7 with the contents of the refresh address register 61 (the minimum and maximum values of the addresses of the memory cells to be self-refreshed) and, when they match (that is, when it is detected that the address falls within the self-refresh address range), sets its output signal CMP to the high level "H". That is, in the self-refresh mode, the comparator 12 is activated by the self-refresh control signal SR2 and compares the addresses; at other times in the self-refresh mode, the output CMP is held to the low level "L".

Figure 3:
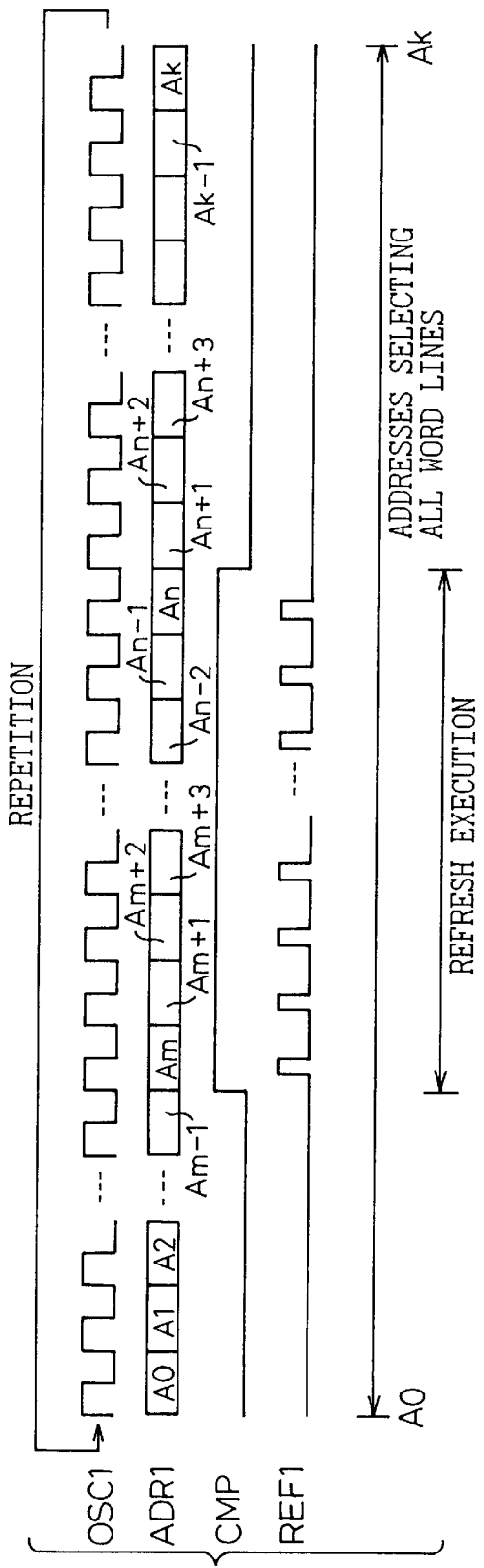
FIG. 3 is a diagram for explaining self-refresh operation in the semiconductor memory device of FIG. 2.

FIG. 3 is a diagram for explaining the self-refresh operation in the semiconductor memory device of FIG. 2.

As shown in FIG. 3, the comparator 12 compares the minimum value Am and maximum value An, stored in the refresh address register 61 and defining the address range of the memory cells for self refresh, with the refresh address ADR1 (A0 to Ak) generated by the refresh counter 7; within the matching address range of Am to An, the output signal CMP is raised to the high level "H", and self refresh is performed, but within non-matching address ranges of A0 to Am-1 and An+1 to Ak, the output signal CMP is held to the low level "L", and self refresh is not performed.

More specifically, when the input signal (output signal of the comparator 12) CMP to the AND gate is at the high level "H", the refresh control signal REF2 output from the refresh control circuit 4 is supplied as a refresh control signal REF1 to the RAS-related control circuit 8 and the selector 10, and self refresh is performed only on the memory cells within the self-refresh address range of Am to An.

On the other hand, in the active mode, as in the prior art semiconductor memory device described with reference to FIG. 1, when an external refresh command (AUTO REFRESH) is input, the command decoder 2 issues a refresh command signal AR1 to the refresh control circuit 4 which, based on the refresh command signal AR1, generates the refresh control signal REF2. Here, the chip select signal /CS, row address strobe signal /RAS, column address strobe signal /CAS, and write enable signal /WE are input to the command decoder 2, and the clock CLK and clock enable signal CKE are input to the CLK buffer 1, while the address signals A0 to Ak are input to the address buffer 3. The refresh command (AUTO REFRESH) here is externally supplied, for example, as a combination of the clock enable signal CKE, row address strobe signal /RAS, etc.

The refresh address counter 7 is configured as a counter which counts up the address by one each time the refresh control signal REF2 is input, and automatically generates the refresh address ADR1 for every input of the refresh control signal REF2. The refresh control signal REF2 is also supplied to the AND gate 13 which ANDs it with the output CMP of the comparator 12 and supplies the refresh control signal REF1 to the RAS-related control circuit 8 and the selector 10. Here, the output CMP of the comparator 12 is held to the low level "L", except during the self-refresh operation.

To implement the power-down mode, when an external self-refresh command (SELF REFRESH) is applied during the active mode, the command decoder 2 issues a self-refresh command signal SR1, and the device is placed in the power down mode; the refresh control circuit 4 then issues the control signal SR2 to activate the oscillator (OSC) 5 and, based on the clock signal generated by the oscillator 5, periodically generates the refresh control signal REF2 which is supplied to the refresh address counter 7 and the AND gate 13.

The refresh control signal REF1 is supplied to the selector 10; when the refresh control signal REF1 is input, the selector 10 selects the refresh address ADR1 output from the refresh address counter 7, otherwise (when the refresh control signal REF1 is not input) it selects an externally supplied address AD1 delivered from the address buffer 3, and whichever address is selected is passed to the address latch 11. The refresh control signal REF1 is also supplied to the RAS-related control circuit 8 which thereupon refreshes the memory cells connected to the word line in the DRAM core 9 which is selected by the output of the address latch 11.

According to the first embodiment of the present invention, address information designating the memory cells to be self-refreshed in the power down mode is externally loaded into the refresh address register 61, and self refresh is performed (to refresh only the area where data needs to be retained) only when the address generated by the refresh address counter 7 falls within the address range specified by the refresh address register 61. This contributes to reducing the power consumption in refresh operation.

Figure 4:
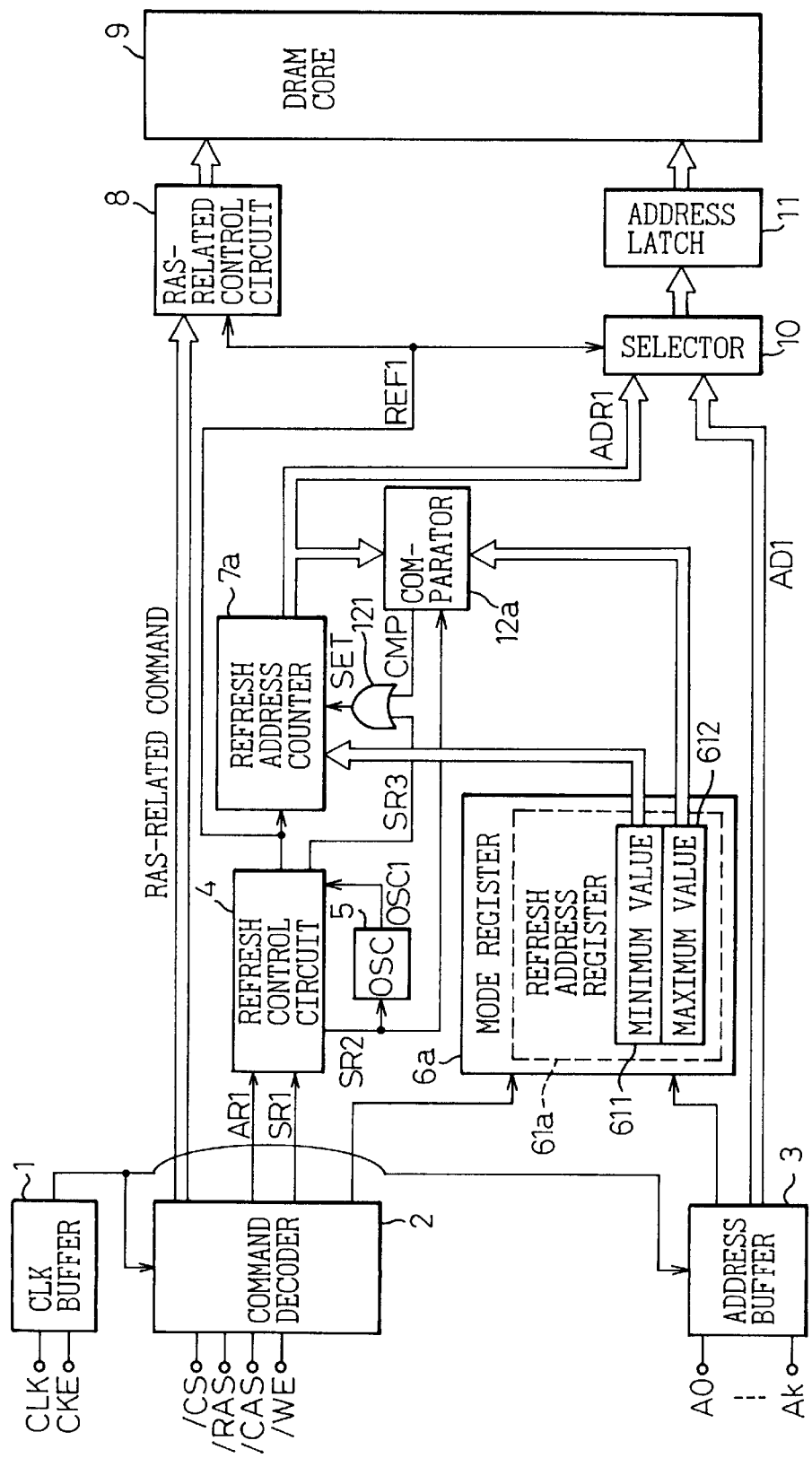
FIG. 4 is a block diagram showing a second embodiment of a semiconductor memory device according to the present invention.
Figure 5:
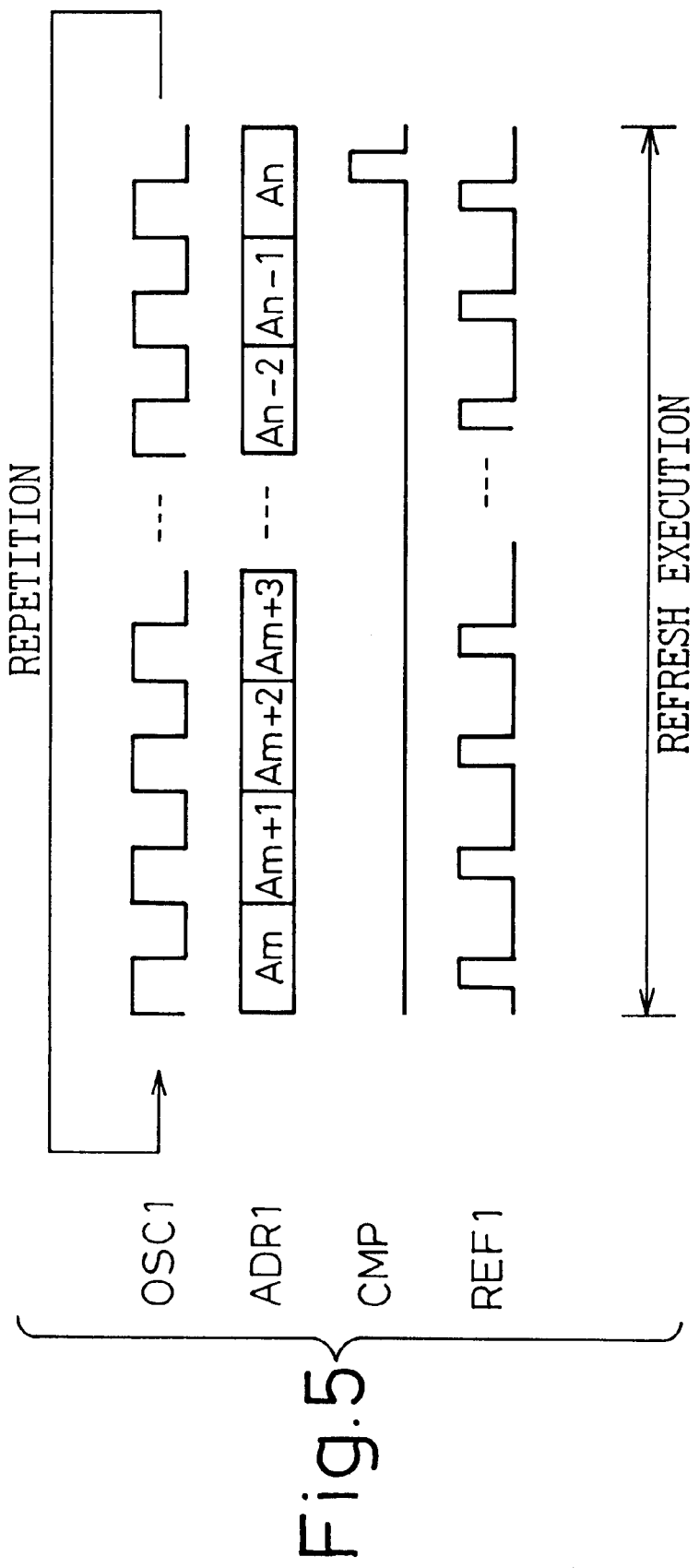
FIG. 5 is a diagram for explaining self-refresh operation in the semiconductor memory device of FIG. 4.

FIG. 4 is a block diagram showing a second embodiment of the semiconductor memory device according to the present invention, and FIG. 5 is a diagram for explaining the self-refresh operation in the semiconductor memory device of FIG. 4.

The second embodiment shown in FIG. 4 achieves a further reduction in power consumption by imposing a restriction on the operation of the refresh address counter 7 (7a) which was constantly kept operating in the first embodiment shown in FIG. 2. In FIG. 4, reference numeral 6a is a mode register, 61a is a refresh address register, 611 is a register for storing a refresh address minimum value, 612 is a register for storing a refresh address maximum value, 7a is a refresh address counter, 12a is a comparator, and 121 is an OR gate.

As shown in FIG. 4, in the second embodiment, the refresh address minimum value (611) stored in the refresh address register 61a is supplied directly to the refresh address counter 7a, while the refresh address maximum value (612) stored in the refresh address register 61a is supplied to the comparator 12a. The output signal CMP of the comparator 12a and the self-refresh control signal SR3 output from the refresh control circuit 4 are ORed by the OR gate 121 and supplied as a set signal SET to the refresh address counter 7a.

In the second embodiment, when the self-refresh mode is entered, first the self-refresh control signal (pulse signal) SR3 is issued (one pulse is output) and applied to the OR gate 121 which then outputs the set signal SET to the refresh address counter 7a, whereupon the refresh address minimum value (611: Am) held in the refresh address register 61a is set as the initial value in the refresh address counter 7a. Then, self refresh is started, and the refresh operation is performed, starting at address Am. When the refresh address ADR1 output from the refresh address counter 7a reaches the refresh address maximum value (612: An) held in the refresh address register 61a, the comparator 12 produces an output signal (pulse signal) CMP (one pulse is output). This signal CMP is supplied via the OR gate as the set signal SET to the refresh address counter 7a, whereupon the refresh address value in the refresh address counter 7a is reset to the initial value (Am). Thereafter, the above operation is repeated. In this way, the refresh address counter 7a operates only within the address range (Am to An) set in the refresh address register 61a.

In the second embodiment, the refresh address register 61a is set up to store the minimum value Am (611) and maximum value An (612) of the addresses of the memory cells to be self-refreshed, but the register may be configured to store only the minimum value Am or the maximum value An. That is, when only the minimum value Am (611) is stored in the refresh address register 61a, self refresh is performed within the address range of Am to Ak, while when only the maximum vgalue An (612) is stored in the refresh address register 61a, self refresh is performed within the address range of A0 to An.

In the refresh operation in the active mode, since neither the self-refresh control signal SR3 nor the output signal CMP of the comparator 12a is produced, the refresh address counter 7a generates addresses for refreshing all the memory cells in the DRAM core 9.

Figure 6:
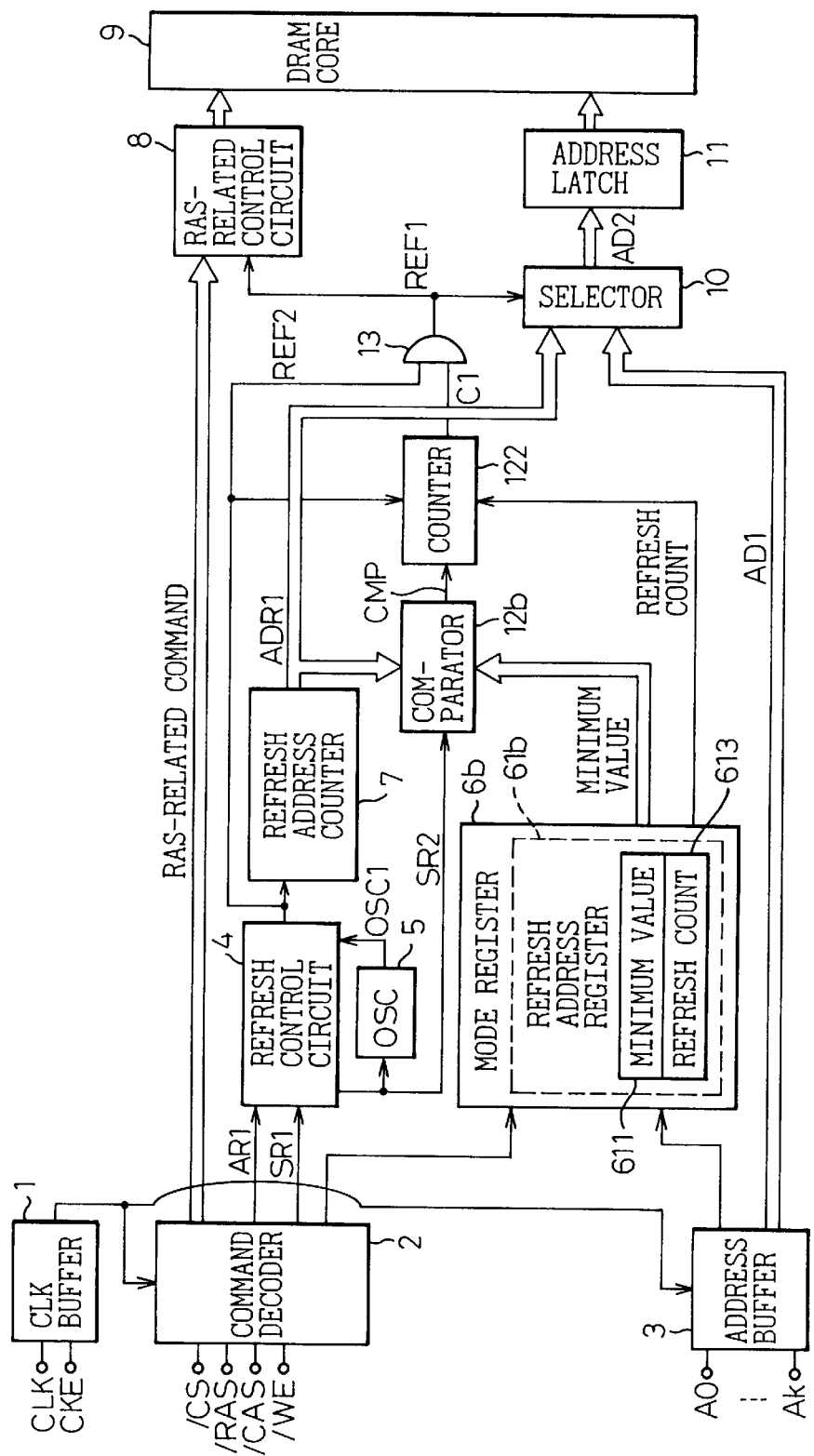
FIG. 6 is a block diagram showing a third embodiment of a semiconductor memory device according to the present invention.

FIG. 6 is a block diagram showing a third embodiment of the semiconductor memory device according to the present invention. In FIG. 6, reference numeral 6b is a mode register, 61b is a refresh address register, 611 is a register for storing a refresh address minimum value, 613 is a register for storing a count of the number of refresh operations, 12b is a comparator, and 122 is a counter.

In the third embodiment shown in FIG. 6, a count of the number of refresh operations (613) is stored instead of the refresh address maximum value (612) stored in the refresh address register 61 (61a) in the foregoing first and second embodiments.

That is, as shown in FIG. 6, in the third embodiment, the refresh address maximum value (611: Am) and the refresh count (613) are stored in the refresh address register 61b, and the number of refresh operations (613) is counted by the counter 122.

More specifically, in the third embodiment, in the self-refresh mode the refresh address counter 7 generates a refresh address ADR1 by counting up, and the comparator 12b compares the refresh address ADR1 with the refresh address minimum value (611: Am) and, when they match, produces an output signal CMP. In response to the signal CMP, the counter 122 produces an output signal C1 of high level "H", and starts counting the number of occurrences of the refresh control signal REF2 output from the refresh control circuit 4; when the number of occurrences matches the count information (613) held in the refresh address register 61b, the signal C1 is set to the low level "L". In this way, the signal REF2 is supplied as the refresh control signal REF1 to the RAS-related control circuit 8 and the selector 10 only during the period that the signal C1 is at the high level "H". In other respects, the configuration is the same as that of the first embodiment shown in FIG. 1, and the description will not be repeated here.

Alternatively, the refresh address register 61b may be configured to store a refresh address maximum value instead of the refresh address minimum value (611), and self refresh may be performed, starting from the refresh address maximum value until reaching the predetermined refresh count (613).

Figure 7:
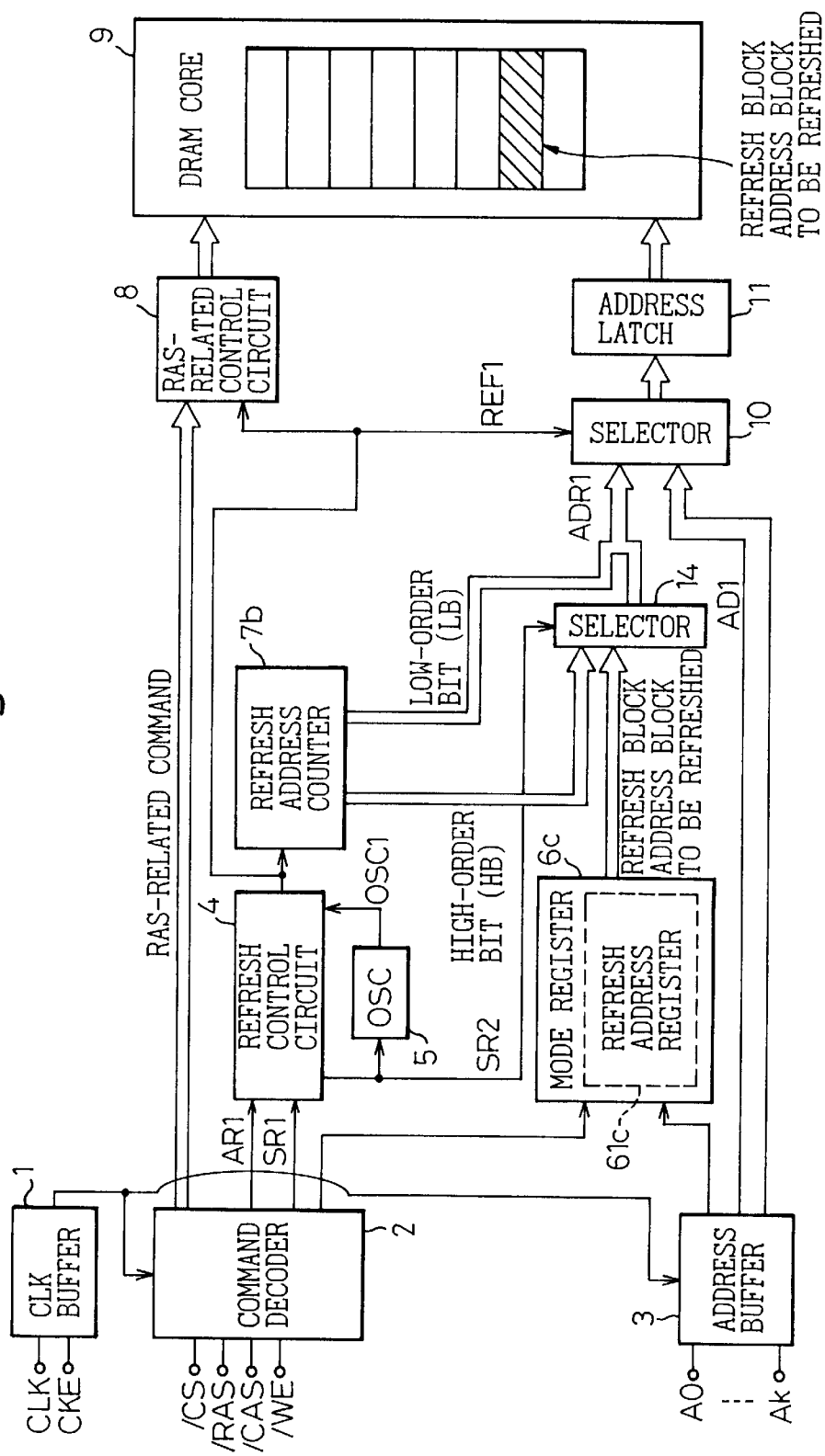
FIG. 7 is a block diagram showing a fourth embodiment of a semiconductor memory device according to the present invention.

FIG. 7 is a block diagram showing a fourth embodiment of the semiconductor memory device according to the present invention. In the fourth embodiment shown in FIG. 7, the block address of a memory cell block to be refreshed in the DRAM core 9 is stored in the refresh address register 61c provided as part of the mode register 6c.

This embodiment is effective, for example, when the DRAM core 9 is constructed from a plurality of memory cell blocks and when self refresh is applied only to a selected memory cell block in the DRAM core 9. In this case, a block select address designating the block to be self-refreshed is stored in the refresh address register 61c, and the refresh address counter 7b is configured to separately output the high-order bit HB used for block selection and the low-order bit LB used for the selection of a word line within the designated block.

More specifically, in the self-refresh mode, when the self-refresh control signal SR2 is input from the refresh control circuit 4, a selector 14 selects the block select address held in the refresh address register 61c for output to the selector 10; otherwise, the high-order bit HB output from the refresh address counter 7b is selected for output to the selector 10.

In the first to fourth embodiments of the present invention so far described, the number of memory cells for self refresh can be varied by setting the refresh address register 61 (61a, 61b, 61c) accordingly. That is, in the first and second embodiments, it can be varied by changing the minimum and maximum value settings, and in the third embodiment, it is only necessary to change the count setting, while in the fourth embodiment, provisions should be made so that more than one refresh block address can be set.

Each memory cell selected for self refresh must be refreshed once within a predetermined interval of time. In the first and third embodiment, this can be accomplished by designing the oscillator 5 so that the refresh address counter 7 cycles once within the predetermined interval of time in the self refresh mode, but in the second and fourth embodiments, if the number of memory cells for self refresh increases, the time interval at which any particular memory cell is refreshed becomes long. In view of this, if the number of memory cells for self refresh increase, the frequency of occurrence of the refresh control signal REF1 must be increased (if the number of memory cells for self refresh decreases, the frequency of occurrence of the refresh control signal REF1 should be reduced). An embodiment (fifth embodiment) that addresses this is shown in FIG. 8.

Figure 8:
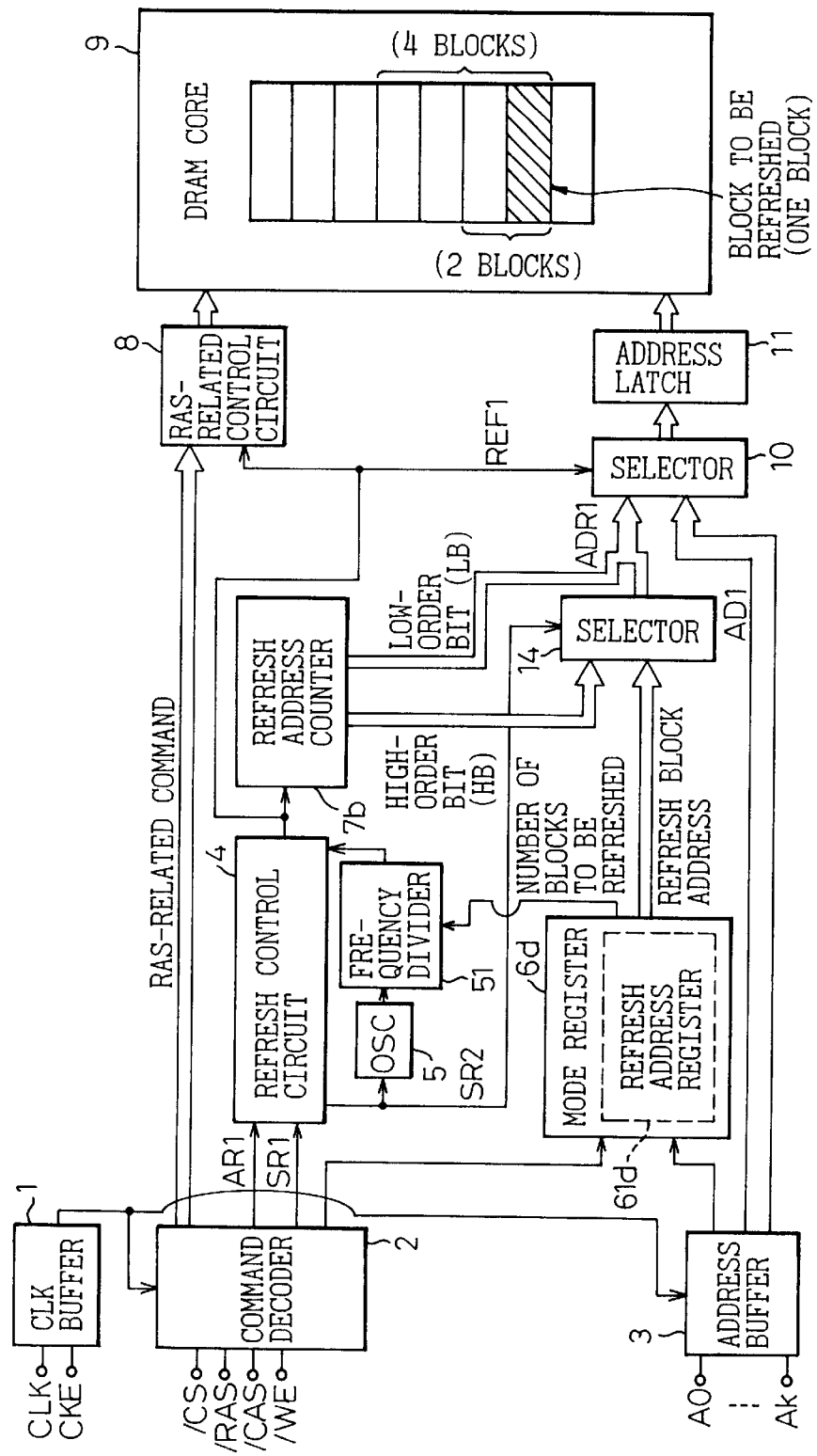
FIG. 8 is a block diagram showing a fifth embodiment of a semiconductor memory device according to the present invention.

FIG. 8 is a block diagram showing the fifth embodiment of the semiconductor memory device according to the present invention, in which reference numeral 51 is a frequency divider.

As shown in FIG. 8, in the fifth embodiment, the output of the oscillator 5 is frequency divided by the frequency divider 51 before being supplied to the refresh control circuit 4. The refresh address register 61c stores information on the number of memory cell blocks to be self-refreshed, and the divide-by ratio in the frequency divider 51 is varied based on this information. More specifically, suppose, for example, that the number of memory cell blocks to be self-refreshed is 4, 2, and 1, respectively, and that the output (frequency) of the frequency divider 51 when the number of memory cell blocks is 4 is set as the reference (unity). Then, the divide-by ratio is set so that the frequency is reduced to one half and one quarter of the reference frequency when the number of memory cell blocks is 2 and 1, respectively. In this way, since the refresh address counter 7, etc. are driven with the lowest necessary frequency, the power consumption can be further reduced.

The semiconductor memory device of the present invention has been described by taking a DRAM (SDRAM) as an example, but it will be appreciated that the present invention is equally applicable to various other semiconductor memory devices, such as SyncLink DRAM and Rambus DRAM (RDRAM), that require periodic refreshing to retain the contents of memory cells.

As described in detail above, according to the present invention, a semiconductor memory device is provided that can reduce power consumption in a refresh operation and can drastically cut power consumption in a power down mode, by refreshing necessary areas only.

Many different embodiments of the present invention may be constructed without departing from the spirit and scope of the present invention, and it should be understood that the present invention is not limited to the specific embodiments described in this specification, except as defined in the appended claims.

What is claimed is:

1. A semiconductor memory device refreshing memory cells to retain data, comprising:
   a first refresh mode for refreshing all of said memory cells;
   a second refresh mode for refreshing at least part of said memory cells; and
   a refresh address register for storing address information designating the memory cells to be refreshed in said second refresh mode.

2. The semiconductor memory device as claimed in claim 1, wherein said refresh address register is provided as part of a mode register.

3. The semiconductor memory device as claimed in claim 1, wherein said semiconductor memory device further comprises:
   a refresh address counter for generating a refresh address; and
   a comparator for comparing the refresh address with the information stored in said refresh address register, and wherein:
      in said first refresh mode, refreshing is performed at each refresh address generated by said refresh address counter, and
      in said second refresh mode, refreshing is performed in accordance with a comparison result output from said comparator.

4. The semiconductor memory device as claimed in claim 3, wherein the information stored in said refresh address register includes a minimum value defining an address range within which refreshing is performed in said second refresh mode.

5. The semiconductor memory device as claimed in claim 3, wherein the information stored in said refresh address register includes a maximum value defining an address range within which refreshing is performed in said second refresh mode.

6. The semiconductor memory device as claimed in claim 3, wherein the information stored in said refresh address register includes a minimum value and a maximum value defining an address range within which refreshing is performed in said second refresh mode.

7. The semiconductor memory device as claimed in claim 3, wherein the information stored in said refresh address register includes a count of the number of refresh operations required to refresh all of the memory cells designated to be refreshed in said second refresh mode.

8. The semiconductor memory device as claimed in claim 3, wherein the information stored in said refresh address register includes an initial value to be set in said refresh address counter.

9. The semiconductor memory device as claimed in claim 8, wherein the initial value to be set in said refresh address counter is a minimum value or a maximum value defining an address range within which refreshing is performed.

10. The semiconductor memory device as claimed in claim 3, wherein the information stored in said refresh address register includes an initial value to be set in said refresh address counter and a count of the number of refresh operations required to refresh all of the memory cells designated to be refreshed in said second refresh mode.

11. The semiconductor memory device as claimed in claim 10, wherein the initial value to be set in said refresh address counter is a minimum value or a maximum value defining an address range within which refreshing is performed.

12. The semiconductor memory device as claimed in claim 3, wherein said semiconductor memory device further comprises a plurality of memory cell blocks, and wherein
   the information stored in said refresh address register includes address information for selecting a memory cell block to be refreshed in said second refresh mode.

13. The semiconductor memory device as claimed in claim 1, wherein said semiconductor memory device further comprises a refresh address counter for generating a refresh address, and wherein:
   in said first refresh mode, refreshing is performed at each refresh address generated by said refresh address counter, and
   in said second refresh mode, a count range within which said refresh address counter generates the refresh address is limited in accordance with the information stored in said refresh address register.

14. The semiconductor memory device as claimed in claim 13, wherein the information stored in said refresh address register includes a minimum value defining an address range within which refreshing is performed in said second refresh mode.

15. The semiconductor memory device as claimed in claim 13, wherein the information stored in said refresh address register includes a maximum value defining an address range within which refreshing is performed in said second refresh mode.

16. The semiconductor memory device as claimed in claim 13, wherein the information stored in said refresh address register includes a minimum value and a maximum value defining an address range within which refreshing is performed in said second refresh mode.

17. The semiconductor memory device as claimed in claim 13, wherein the information stored in said refresh address register includes a count of the number of refresh operations required to refresh all of the memory cells designated to be refreshed in said second refresh mode.

18. The semiconductor memory device as claimed in claim 13, wherein the information stored in said refresh address register includes an initial value to be set in said refresh address counter.

19. The semiconductor memory device as claimed in claim 18, wherein the initial value to be set in said refresh address counter is a minimum value or a maximum value defining an address range within which refreshing is performed.

20. The semiconductor memory device as claimed in claim 13, wherein the information stored in said refresh address register includes an initial value to be set in said refresh address counter and a count of the number of refresh operations required to refresh all of the memory cells designated to be refreshed in said second refresh mode.

21. The semiconductor memory device as claimed in claim 20, wherein the initial value to be set in said refresh address counter is a minimum value or a maximum value defining an address range within which refreshing is performed.

22. The semiconductor memory device as claimed in claim 13, wherein said semiconductor memory device further comprises a plurality of memory cell blocks, and wherein
the information stored in said refresh address register includes address information for selecting a memory cell block to be refreshed in said second refresh mode.

23. The semiconductor memory device as claimed in claim 1, wherein said semiconductor memory device further comprises:
a refresh address counter for counting a first refresh address; and
a refresh address generator for generating a second refresh address based on at least part of the output of said refresh address counter and on the information stored in said refresh address register, and wherein:
in said first refresh mode, refreshing is performed at the first refresh address, and
in said second refresh mode, refreshing is performed at the second refresh address.

24. The semiconductor memory device as claimed in claim 23, wherein said refresh address generator includes a selector.

25. The semiconductor memory device as claimed in claim 23, wherein said semiconductor memory device further comprises a plurality of memory cell blocks, and wherein
the information stored in said refresh address register includes address information for selecting a memory cell block to be refreshed in said second refresh mode.

26. The semiconductor memory device as claimed in claim 1, wherein, in said first refresh mode, refreshing is performed in synchronism with an external timing signal, and,
in said second refresh mode, refreshing is performed in synchronism with an internally generated clock.

27. The semiconductor memory device as claimed in claim 26, wherein the frequency of refresh operation in said second refresh mode is varied in accordance with the number of memory cells designated by the information stored in said refresh address register as the memory cells to be refreshed.

28. The semiconductor memory device as claimed in claim 1, wherein said second refresh mode is a mode for performing self refresh on memory cells when in a power down state.

* * * * *